(12) United States Patent
Kim et al.

(10) Patent No.: US 9,152,041 B2
(45) Date of Patent: Oct. 6, 2015

(54) DISPLAY PANEL INCLUDING PATTERNED SPACER

(75) Inventors: Sung Hyun Kim, Daejeon (KR); Jin Suek Kim, Daejeon (KR); Kyung Jun Kim, Daejeon (KR); Seung Hee Lee, Seoul (KR); Il Eok Kwon, Seoul (KR); Jeong Ae Yoon, Masan-si (KR)

(73) Assignee: LG CHEM, LTD., Seoul (KR)

( * ) Notice: Subject to any disclaimer, the term of this patent is extended or adjusted under 35 U.S.C. 154(b) by 1847 days.

(21) Appl. No.: 11/629,476

(22) PCT Filed: Jul. 5, 2005

(86) PCT No.: PCT/KR2005/002121
§ 371 (c)(1),
(2), (4) Date: Oct. 16, 2007

(87) PCT Pub. No.: WO2006/004364
PCT Pub. Date: Jan. 12, 2006

(65) Prior Publication Data
US 2008/0213514 A1  Sep. 4, 2008

(30) Foreign Application Priority Data

Jul. 5, 2004  (KR) .......................... 10-2004-0052104

(51) Int. Cl.
*C09K 19/00* (2006.01)
*G03F 7/00* (2006.01)
*G03F 7/029* (2006.01)

(52) U.S. Cl.
CPC ............ *G03F 7/0007* (2013.01); *G03F 7/0295* (2013.01); *Y10T 428/10* (2015.01); *Y10T 428/1073* (2015.01)

(58) Field of Classification Search
CPC ....... G03F 7/007; G03F 7/028; G03F 7/0295; G08F 7/028; G08F 7/0295; G02F 1/136209; C08F 20/06; C09D 11/107; C09D 133/02; Y10T 428/10; Y10T 428/1073
USPC .......... 428/1.5, 1.53, 1.55, 1.1; 349/155, 156, 349/106, 110; 522/8, 9, 26, 63; 544/180, 544/193; 430/281.1, 286.1, 325
See application file for complete search history.

(56) References Cited

U.S. PATENT DOCUMENTS 4,239,850 A  12/1980 Kita et al.
4,772,534 A *  9/1988 Kawamura et al. ............. 522/63
(Continued)

FOREIGN PATENT DOCUMENTS

CN  1198820  11/1998
CN  1437586  8/2003
(Continued)

OTHER PUBLICATIONS

Machine translation of JP 2001-151829A.*

*Primary Examiner* — Ruiyun Zhang
(74) *Attorney, Agent, or Firm* — Dentons US LLP

(57) ABSTRACT

Disclosed is a display panel including a lower substrate, upper substrate, and a patterned spacer that causes the lower substrate and upper substrate to be spaced apart from each other by a predetermined distance, wherein the patterned spacer is obtained from a photosensitive resin composition comprising: (a) a triazine-based photopolymerization initiator represented by the following formula 1; (b) an alkali-soluble photo polymerizable reactive resin binder; and (c) a polymerizable compound:

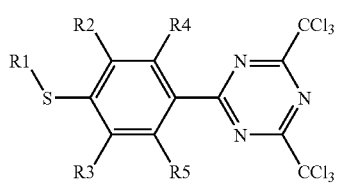

[Formula 1]

(wherein each of R1-R5 has the same meaning as defined herein). A photosensitive resin composition for use in a patterned spacer is also disclosed, the composition comprising: (a) a triazine-based photopolymerization initiator represented by the following formula 1; (b) an alkali-soluble photopolymerizable reactive resin binder; (c) a polymerizable compound; and (d) a solvent. The photosensitive resin composition shows high sensitivity and excellent properties related with development, and provides a patterned spacer having excellent strength, sensitivity, residue characteristics, film uniformity, residual film ratio, etc.

15 Claims, 1 Drawing Sheet

(56) References Cited

U.S. PATENT DOCUMENTS

| | | | |
|---|---|---|---|
| 5,574,117 A * | 11/1996 | Yoshida et al. | 526/224 |
| 6,275,280 B1 * | 8/2001 | Kajita et al. | 349/155 |
| 6,797,739 B1 | 9/2004 | Kim et al. | |
| 2003/0143486 A1 * | 7/2003 | Kubota et al. | 430/281.1 |

FOREIGN PATENT DOCUMENTS

| | | |
|---|---|---|
| EP | 1 153 935 A1 | 11/2001 |
| JP | 2000-063684 | 2/2000 |
| JP | 2001-151829 | 6/2001 |
| JP | 2003-084117 | 3/2003 |
| JP | 2003-207787 | 7/2003 |
| JP | 2004-503545 | 2/2004 |
| JP | 2004-109989 | 4/2004 |
| WO | WO 98/05997 | 2/1998 |
| WO | WO 01/96317 A1 | 12/2001 |
| WO | WO 03/010602 A1 | 2/2003 |
| WO | WO 2004086146 A1 * | 10/2004 |

* cited by examiner

DISPLAY PANEL INCLUDING PATTERNED SPACER

This application claims priority to International Application No. PCT/KR2005/002121, filed on Jul. 5, 2005, and Korean Patent Application No. 10-2004-0052104, filed on Jul. 5, 2004, which are hereby incorporated by reference in their entirety.

TECHNICAL FIELD

The present invention relates to a display panel including a patterned spacer. More particularly, the present invention relates to a display panel including an upper substrate, a lower substrate facing to the upper substrate and a patterned spacer interposed between the upper substrate and lower substrate, and to a photosensitive resin composition for use in a patterned spacer.

BACKGROUND ART

Typical examples of display panels are liquid crystal display panels. A liquid crystal display panel includes a lower substrate and upper substrate, wherein each substrate has an electric field-generating electrode at one surface thereof and both substrates face each other with a liquid crystal layer interposed between them.

Such liquid crystal display panels may be classified into passive-matrix liquid crystal display panels and active-matrix liquid crystal display panels depending on methods for switching a liquid crystal molecule array. Particularly, active-matrix liquid crystal display panels are obtained by forming multiple pixels on a liquid crystal display panel and mounting a switching element to each pixel. Thus, it is possible to obtain relatively high picture quality and high response rate by controlling on/off operations of each pixel independently and to provide excellent resolution and moving picture realizing quality. As the switching element, a thin-film transistor (TFT) is generally used.

FIG. 1 is an exploded perspective view showing a general active-matrix liquid crystal display panel and FIG. 2 is a sectional view taken along line II-II in FIG. 1. Hereinafter, structural characteristics of a general liquid crystal display panel will be explained with reference to FIGS. 1 and 2.

A general active-matrix liquid crystal display panel includes a lower substrate 10 and upper substrate 30, wherein each substrate has an electric field-generating electrode at one surface thereof and both electrodes face each other, and a liquid crystal display layer 40 interposed between the lower substrate 10 and upper substrate 30.

The lower substrate 10 includes a plurality of parallel gate lines 14 each outputting a scanning voltage and a plurality of parallel data lines 16 each outputting an image voltage arrayed in a crossing pattern so as to define net-shaped pixel zones P on a first transparent substrate 12 such as glass. Additionally, a thin-film transistor T is disposed at each intersecting point of the gate lines 14 and data lines 16. Further, a first electrode 18 connected to a thin film transistor T with a one-to-one correspondence is mounted on each pixel zone P.

The first electrode 18 serves as working electric field-generating electrode for applying electric voltage to the liquid crystal display layer 40. A portion where the first electrode is disposed becomes a display zone of the liquid crystal display panel and other portions become non-display zones. Additionally, the thin-film transistor T is turned on/off through a signal voltage outputted to the gate lines 14 and serves as switching element for applying the signal voltage outputted from the data lines 16 selectively to the first electrode 18.

Additionally, the upper substrate 30 includes a second transparent substrate 32 such as glass, whose back surface has a color filter layer 36 including a plurality of color filters 36a, 36b, 36c arrayed with adjacent to each other so as to shield a ray of light with a certain wavelength and a second electrode 38 serving as another electric field-generating electrode, in turn.

Further, a black matrix 34 is disposed between the second transparent substrate 32 and color filter layer 36, the black matrix 34 serving to prevent a light leakage phenomenon that may be generated at the boundary zones of adjacent color filters 36a, 36b, 36c and to interrupt light incoming into the thin-film transistor T.

The liquid crystal layer 40 is interposed between the lower substrate 10 and upper substrate 30.

In the above-described liquid crystal display panel, the liquid crystal layer 40 should maintain a constant thickness between both substrates. To accomplish this, a spacer is disposed between both substrates.

In general, spacer beads such as glass beads, plastic beads, etc., having a predetermined particle diameter are used in liquid crystal display panels and touch panels in order to maintain a constant distance between an upper substrate and lower substrate. However, because such spacer beads are applied randomly, they may be present at efficient pixel portions through which light is transmitted, resulting in distortion of alignment of liquid crystals and a drop in contrast ratio. Additionally, such spacer beads are problematic in that they can move freely in a liquid crystal cell and can be distributed non-uniformly, resulting in generation of undesirable marks due to the agglomeration of spacer beads in some cases.

To solve these problems, it is suggested to form a spacer by lithography. Such lithographic methods include applying a photosensitive resin composition onto a substrate, irradiating a predetermined portion of the substrate with ultraviolet rays by using a desired mask, carrying out development with an alkaline developer solution to form a spacer pattern having a desired shape, and then carrying out a final curing step to stabilize the pattern. Herein, a spacer formed by the above-described method is referred to as "patterned spacer".

FIG. 2 is a sectional view taken along line II-II in FIG. 1 and shows a cross section obtained by cutting the liquid crystal display panel as shown in FIG. 1 along the part having a spacer, after the lamination of the lower substrate 10 and upper substrate 30.

As shown in FIG. 2, the second electrode 38, color filter layer 36, black matrix 34 and the second transparent substrate 32 are disposed, in turn, on the patterned spacer 20. Below the spacer 20, the first transparent substrate 12 is disposed.

The patterned spacer 20 formed by lithography can be disposed at non-display zones on demand and can be precisely controlled for its height. Therefore, such patterned spacers can impart high reliability in maintaining a distance between both substrates. Additionally, such patterned spacers have advantages in that it is possible to increase the solidity of a product due to the fixed position of a spacer and to prevent a so-called ripple phenomenon upon touching a screen.

There is no particular limitation in positions of the patterned spacer 20 as long as the patterned spacer 20 is disposed in non-display zones. Thus, the patterned spacer 20 is frequently disposed on the thin-film transistor T. Additionally, in the case of a high-aperture liquid crystal display device wherein edges of the first electrode 18 are overlapped with adjacent gate lines 14 and data lines 16, it is possible to mount the patterned spacer 20 on such overlapped first electrode.

When the above lithographic method is used, the above-mentioned problems occurring in the prior art can be solved by forming a spacer pattern in a position other than efficient pixel portions so as to prevent distortion of a desired liquid crystal array. Additionally, because spin coating conditions may be varied to form a coating layer with a variable thickness, it is possible to manufacture liquid crystal display panels with various modes having different cell intervals by using one kind of photosensitive resin composition for a patterned spacer.

Characteristics needed for photosensitive resin compositions for patterned spacers are as follows.

A patterned spacer should have such a high strength as to maintain the distance between a lower substrate and upper substrate.

Additionally, a patterned spacer is generally formed to have a coating layer with a thickness of 3 microns or more and a major portion of the coating layer should be developed. Therefore, a photosensitive resin composition for a patterned spacer should be dissolved into a developer solution in a short time and in a large amount. Further, when clear development is not made, various display defects such as spot formation due to residues after development and undesirable alignment of liquid crystals may occur. Therefore, the photosensitive resin composition should have excellent developability.

Meanwhile, when a glass substrate with large surface area is applied, it is difficult for the substrate to be subjected to full-surface exposure, and thus the substrate is subjected to exposure in multiple portions. Thus, when a photosensitive resin composition with low sensitivity is used, it is inevitable that the time needed for exposure becomes longer, resulting in a drop in the productivity. Therefore, a photosensitive resin composition for a patterned spacer should have high sensitivity.

Further, when carrying out a process of forming an alignment layer after a process of manufacturing a patterned spacer, it is necessary for the photosensitive resin composition to have excellent thermal stability for maintaining the original shape and thickness of a patterned spacer even under high temperature conditions of 200° C. or higher and to have high compress strength sufficient to resist against external pressure and excellent chemical resistance. In addition to the above, it is necessary for the photosensitive resin composition to have excellent stability with time so as to provide desirable characteristics stably without any changes even under long-term storage conditions.

Japanese Laid-Open Patent No. 2001~151829 discloses a photosensitive resin composition for a patterned spacer. However, the photosensitive resin composition using a thermosetting binder has poor stability with time and low photosensitivity. Therefore, the composition is problematic in that it cannot realize a stable pattern under an exposure dose of 150 mJ/cm² or less.

Therefore, it is desirable to provide a photosensitive resin composition having excellent strength, sensitivity, developability, thermal stability, chemical resistance and stability with time.

DISCLOSURE OF THE INVENTION

We have found that a triazine-based photopolymerization initiator represented by the following formula 1 has high sensitivity and can cause the solubility difference between an exposed portion and non-exposed portion to be increased rapidly. We have also found that when the triazine-based photopolymerization initiator is incorporated into a photosensitive resin composition along with a photopolymerizable reactive alkali-soluble resin binder, it is possible to improve the sensitivity and developability of the photosensitive resin composition significantly. Additionally, we have found that it is possible to form a patterned spacer having excellent strength, sensitivity, residue characteristics, film uniformity, residual film ratio, etc., by using the photosensitive resin composition using the triazine-based photopolymerization initiator.

Therefore, it is an object of the present invention to provide a display panel including a patterned spacer having excellent strength, sensitivity and developability, and a photosensitive resin composition for use in the above patterned spacer.

According to an aspect of the present invention, there is provided a display panel including a lower substrate, upper substrate, and a patterned spacer that causes the lower substrate and upper substrate to be spaced apart from each other by a predetermined distance, wherein the patterned spacer is obtained from a photosensitive resin composition comprising: (a) a triazine-based photopolymerization initiator represented by the following formula 1; (b) an alkali-soluble photopolymerizable reactive resin binder; and (c) a polymerizable compound.

[Formula 1]

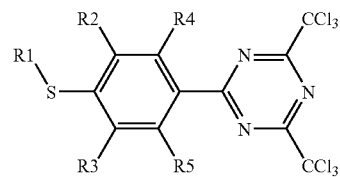

wherein R1 is selected from the group consisting of $C_nH_{2n}CONH_2$ (wherein n is an integer of 1~12), $C_nH_{2n}COOC_mH_{2m+1}$ (wherein n is an integer of 1~12 and m is an integer of 0~12), $(CH_2)_nCOOC_mH_{2m}OC_lH_{2l+1}$ (wherein n is an integer of 1~12, m is an integer of 1~12 and l is an integer of 1~12), $(CH_2)_nCOO\text{-cyclo-}C_mH_{2m-1}$ (wherein n is an integer of 1~12, m is an integer of 3~12), $C_nH_{2n}COOR_f$ (wherein n is an integer of 1~12 and $R_f$ is an alkyl group whose hydrogen atoms are partially or totally substituted with fluorine atoms), and $C_nH_{2n}COOR_6$ (wherein n is an integer of 1~12 and $R_6$ is an aryl group or a C1-C6 alkyl group having an aryl group); and each of R2, R3, R4 and R5 is independently selected from the group consisting of a hydrogen atom, halogen atom, C1-C6 alkyl group and a C1-C6 alkoxy group.

According to another aspect of the present invention, there is provided a photosensitive resin composition for use in a patterned spacer, the photosensitive resin composition comprising: (a) a triazine-based photopolymerization initiator represented by the above formula 1; (b) an alkali-soluble photopolymerizable reactive resin binder; (c) a polymerizable compound; and (d) a solvent.

In the photosensitive resin composition for a patterned spacer according to the present invention, component (a), i.e., the triazine-based photopolymerization initiator represented by the above formula 1 is a photopolymerization initiator with high sensitivity and has excellent optical efficiency compared to conventional photopolymerization initiators such as Irgacure-369 available from Ciba Specialty Chemicals so that the crosslinking density of a film can be increased and thus mechanical properties such as elastic restorability can be improved. However, when such triazine-based polymerization initiators are used, there is a limitation in increasing pattern sizes (for example, CD (critical dimension)), because a relatively small pattern is formed under the same exposure dose. The so-called CD (critical dimension) means a length along the horizontal direction of a patterned spacer. We have found that when the triazine-based photopolymerization initiator (a) as photopolymerization initiator is used in combination with a photopolymerizable reactive resin binder as alkali-soluble resin binder, it is possible to increase the CD by at least 150% compared to a patterned spacer using a linear resin binder and to improve the heat resistance and chemical resistance of a patterned spacer.

Patterned spacers that can be obtained by using the photosensitive resin composition according to the present invention may have a variable thickness. However, the patterned spacers have a thickness of between 1 and 5 μm under practical processing conditions.

Hereinafter, each of the components forming the patterned spacer or the photosensitive resin composition for a patterned spacer will be explained in more detail.

(a) Triazine-Based Photopolymerization Initiator Represented by Formula 1

A photopolymerization initiator is a compound that can absorb light when irradiated with UV light or the like to generate radical active species through photochemical reactions, thereby causing a photopolymerization reaction. According to the present invention, the triazine-based photopolymerization initiator represented by formula 1 is used as photopolymerization initiator. The triazine-based photopolymerization initiator represented by formula 1 shows a strong absorption band at 360 nm, has high sensitivity and serves to increase the solubility difference between an exposed portion and non-exposed portion.

Particularly, substituent R1 in the triazine-based photopolymerization initiator represented by formula 1 has the meanings as described hereinafter.

When R1 is $C_nH_{2n}CONH_2$, $C_nH_{2n}$ represents a C1-C12 alkylene group and particular examples thereof include methylene, ethylene, 1,2-propylene, 1,3-propylene, 1,4-butylene, pentamethylene, hexamethylene, heptamethylene, octamethylene, nonamethylene, decamethylene, undecamethylene, dodecamethylene, etc.

When R1 is $C_nH_{2n}COOC_mH_{2m+1}$, $C_nH_{2n}$ has the same meaning as $C_nH_{2n}$ in $C_nH_{2n}CONH_2$, and $C_mH_{2m+1}$ represents a C0-C12 alkyl group. Particular examples of C0-C12 alkyl group include a hydrogen atom, methyl, ethyl, propyl, isopropyl, butyl, isobutyl, pentyl, isopentyl, hexyl, heptyl, octyl, 2-ethylhexyl, isooctyl, nonyl, decanyl, undecanyl, dodecanyl, etc.

When R1 is $(CH_2)_nCOOC_mH_{2m}OC_lH_{2l+1}$, each of $(CH_2)_n$ and $C_mH_{2m}$ independently has the same meaning as $C_nH_{2n}$ in $C_nH_{2n}CONH_2$, and $C_lH_{2l+1}$ represents a C1-C12 alkyl group. Particular examples of C1-C12 alkyl group include a methyl, ethyl, propyl, isopropyl, butyl, isobutyl, pentyl, isopentyl, hexyl, heptyl, octyl, 2-ethylhexyl, isooctyl, nonyl, decanyl, undecanyl, dodecanyl, etc.

When R1 is $(CH_2)_nCOO$-cyclo-$C_mH_{2m-1}$, $(CH_2)_n$ has the same meaning as $C_nH_{2n}$ in $C_nH_{2n}CONH_2$, and cyclo-$C_mH_{2m-1}$ represents a C3-C12 alicyclic group having a cyclic group.

When R1 is $C_nH_{2n}COOR_f$, $C_nH_{2n}$ has the same meaning as $C_nH_{2n}$ in $C_nH_{2n}CONH_2$, and $R_f$ represents a C1-C6 alkyl group whose hydrogen atoms are partially or totally substituted with fluorine atoms.

When R1 is $C_nH_{2n}COOR_6$, $C_nH_{2n}$ has the same meaning as $C_nH_{2n}$ in $C_nH_{2n}CONH_2$, and $R_6$ represents a C6-C14 aryl group or a C6-C14 aryl group-containing C1-C6 alkyl group.

In the photosensitive resin composition for a patterned spacer according to the present invention, the triazine-based photopolymerization initiator represented by formula 1 is used preferably in an amount of 0.1-10 parts by weight, more preferably in an amount of 0.5-5 parts by weight based on 100 parts by weight of the total composition. When the photopolymerization initiator is used in an amount of less than 0.1 parts by weight, it shows too low sensitivity to form a pattern sufficiently. When the photopolymerization initiator is used in an amount of greater than 10 parts by weight, it shows relatively poor solubility to a solvent.

(b) Alkali-Soluble Photopolymerizable Reactive Resin Binder

An alkali-soluble resin binder serves to form a matrix when the photosensitive resin composition forms a thin film and comprises a moiety that provides the composition with solubility to an aqueous alkaline developer solution. A photopolymerizable reactive resin binder is a binder including a functional group (for example, an olefin group) capable of reacting with radical species produced by irradiation (for example, UV irradiation). Such functional groups (for example, olefin groups) may react with each other or with another polymerizable compound present in the composition, thereby forming a network structure.

According to the present invention, a photopolymerizable reactive resin binder having excellent compatibility with other components is used as alkali-soluble resin binder, so that the photosensitive resin composition can be improved in terms of chemical resistance and stability with time.

The alkali-soluble photopolymerizable reactive resin bonder is prepared by a two-step synthetic procedure as described hereinafter.

In the first step, a monomer containing an acid functional group is copolymerized with a second monomer copolymerizable with the above monomer to provide an alkali-soluble linear copolymer. As the second monomer, a monomer capable of increasing film strength is used preferably. The monomer capable of increasing film strength may be exemplified by an aromatic ring-containing compound.

Particular examples of the monomer containing an acid functional group for use in the preparation of the linear copolymer include (meth)acrylic acid, crotonic acid, itaconic acid, maleic acid, fumaric acid, monomethylmaleic acid, isoprenesulfonic acid, styrenesulfonic acid, 5-norbornene-2-carboxylic acid, etc. Particular examples of the second monomer copolymerizable with the above monomer include styrene, chlorostyrene, α-methylstyrene, vinyltoluene, methyl (meth)acrylate, ethyl (meth)acrylate, butyl (meth)acrylate, benzyl (meth)acrylate, dimethylaminoethyl (meth)acrylate, isobutyl (meth)acrylate, t-butyl (meth)acrylate, cyclohexyl (meth)acrylate, isobornyl (meth)acrylate, 2-phenoxyethyl(meth)acrylate, tetrahydrofurfuryl(meth)acrylate, hydroxyethyl (meth)acrylate, 2-hydroxypropyl(meth)acrylate, 2-hydroxyl-3-chloropropyl(meth)acrylate, 4-hydroxylbutyl(meth)acrylate, acyloctyloxy-2-hydroxypropyl(meth)acrylate, ethylhexyl acrylate, 2-methoxyethyl(meth)acrylate, 3-methoxybutyl(meth)acrylate, ethoxydietyleneglycol (meth)acrylate, methoxytriethyleneglycol (meth)acrylate, methoxytripropyleneglycol (meth)acrylate, methoxypolyethyleneglycol (meth)acrylate, phenoxydietyleneglycol (meth)acrylate, p-nonylphenoxypolyethyleneglycol(meth)acrylate, nonylphenoxypolypropyleneglycol (meth)acrylate, tetrafluoropropyl (meth)acrylate, 1,1,1,3,3,3-hexafluoroisopropyl(meth)acrylate, octafluoropentyl (meth)acrylate, heptadecafluorodecyl (meth)acrylate, tribromophenyl (meth)acrylate, methyl α-hydroxymethyl acrylate, ethyl α-hydroxymethyl acrylate, propyl α-hydroxymethyl acrylate, butyl α-hydroxymethyl acrylate, etc.

The second step is carried out for imparting reactivity to the binder. In the second step, the alkali-soluble linear copolymer obtained from the first step is subjected to polymerization with an epoxy-containing ethylenically unsaturated compound. Particular examples of the epoxy-containing ethylenically unsaturated compound that may be used include allyl glycidyl ether, glycidyl (meth)acrylate, 3,4-epoxycyclohexylmethyl(meth)acrylate, glycidyl 5-norbornene-2-carboxylate (endo/exo mixture), 5-norbornene-2-methyl-2-carboxylate (endo/exo mixture), 1,2-epoxy-5-hexene, 1,2-epoxy-9-decene, etc. Those compounds may be used alone or in combination for the polymerization.

Preferably, the resin binder used in the present invention has an acid value of about 30-200 KOH mg/g and molecular average molecular weight of between 3,000 and 200,000. More preferably, the resin binder has a molecular weight of between 5,000 and 100,000.

According to the present invention, the alkali-soluble resin binder may be used alone or in combination. The binder is used preferably in an amount of 10-90 parts by weight, more preferably in an amount of 20-70 parts by weight, based on 100 parts by weight of the photosensitive resin composition (solid content basis). When the binder is used in an amount of less than 10 parts by weight, a film formed from the composition has poor adhesion. When the binder is used in an amount of greater than 90 parts by weight, there are problems of low development rate and poor sensitivity.

(c) Polymerizable Compound

A polymerizable compound is a compound containing at least two reactive groups in one molecule and thus experiencing polymerization by radical active species formed by the photopolymerization initiator to form a three-dimensional network structure. According to the present invention, a functional monomer having an ethylenically unsaturated bond may be used as polymerizable compound. Preferably, the functional monomer having an ethylenically unsaturated bond contains at least one unsaturated group capable of addition polymerization and has a boiling point of 100° C. or higher. Particular examples of the functional monomer having an ethylenically unsaturated bond include monofunctional monomers such as polyethyleneglycol mono(meth)acrylate, polypropyleneglycol mono(meth)acrylate, phenoxyethyl methacrylate, etc., and multifunctional monomers such as polyethyleneglycol (meth)acrylate, polypropyleneglycol (meth)acrylate, trimethylolethane tri(meth)acrylate, trimethylolpropane tri(meth)acrylate, neopentylglycol (meth)acrylate, pentaerythritol tetraacrylate, pentaerythritol triacrylate, dipentaerythritol pentaacrylate, dipentaerythritol hexaacrylate, etc. Additionally, the functional monomer having an ethylenically unsaturated bond also includes a functional monomer to which caprolactone is introduced, and particular examples thereof include caprolactone-introduced dipentaerythritol such as KAYARAD DPCA-20, KAYARAD DPCA-30, KAYARAD DPCA-60, KAYARAD DPCA-120, etc., caprolactone-introduced tetrahydrofurfuryl acrylate such as KAYARAD TC-110S, and caprolactone-introduced neopentylglycol hydroxypivalate such as KAYARAD HX-220, KAYARAD HK-620, etc. Other functional monomers that may be used as functional monomer having an ethylenically unsaturated bond include epoxy acrylates of bisphenol A derivatives, novolak-epoxy acrylate, and urethane-based multifunctional acrylates such as U-324A, U15HA, U-4HA, etc. The above-described functional monomer having an ethylenically unsaturated bond may be used alone or in combination.

According to the present invention, the polymerizable compound is used preferably in an amount of 10-80 parts by weight, more preferably in an amount of 20-70 parts by weight, based on 100 parts by weight of the photosensitive resin composition (solid content basis). When the polymerizable compound is used in an amount of less than 10 parts by weight, optical sensitivity or coating film strength may be degraded. When the polymerizable compound is used in an amount of greater than 80 parts by weight, the coating layer of photosensitive resin has excessively high adhesion to permit foreign materials to be adhered thereto with ease and to allow generation of residue during a developing process.

(d) Solvent

According to the present invention, the solvent causes other components to be dissolved therein in order to impart coatability to the photosensitive resin composition. Depending on the amount of solvent, it is possible to control the viscosity of the photosensitive resin composition.

Non-limiting examples of the solvent that may be used in the present invention include acetone, methyl ethyl ketone, methyl isobutyl ketone, methyl cellosolve, ethyl cellosolve, tetrahydrofuran, 1,4-dioxane, ethyleneglycol dimethylether, ethyleneglycol diethylether, propyleneglycol dimethylether, propyleneglycol diethylether, chloroform, methylene chloride, 1,2-dichloroethane, 1,1,1-trichloroethane, 1,1,2-trichloroethane, 1,1,2-trichloroethene, 1,2,3-trichloropropane, hexane, heptane, octane, cyclopentane, cyclohexane, benzene, toluene, xylene, methanol, ethanol, isopropanol, propanol, butanol, tert-butanol, propyleneglycol monomethyl ether, propyleneglycol monoethylether, propyleneglycol monopropylether, propyleneglycol monobutylether, dipropyleneglycol dimethylether, dipropyleneglycol diethylether, dipropyleneglycol monomethylether, methyl carbitol, ethyl carbitol, propyl carbitol, butyl carbitol, cyclopentanone, cyclohexanone, propyleneglycol methylether acetate, propyleneglycol ethylether acetate, propyleneglycol methylether propionate, 3-methoxybutyl acetate, 3-methyl-3-methoxybutyl acetate, ethyl-3-ethoxypropionate, ethyl cellosolve acetate, methyl cellosolve acetate, butyl acetate, propyl acetate, ethyl acetate, etc. Such solvents may be used alone or in combination. Considering control of the viscosity of the photosensitive resin composition, it is preferable that the solvent is used in an amount of 60-90 parts by weight, more preferably in an amount of 65-85 parts by weight based on 100 parts by weight of the total composition. When the solvent is used in an amount of less than 60 parts by weight, it is difficult to provide compatibility of the viscosity with thickness of the composition. When the solvent is used in an amount of greater than 90 parts by weight, it is difficult to realize a thickness suitable for a patterned spacer.

(e) Sensitizer

The photosensitive resin composition according to the present invention may further comprise a sensitizer in addition to essential components (a)-(d). The sensitizer can serve to transfer the activation energy generated by absorbing light upon irradiation (e.g. UV irradiation) to the photopolymerization initiator.

According to the present invention, a conventional photopolymerization initiator may be used as sensitizer. It is expected that such conventional photopolymerization initiator used in combination with the photopolymerization initiator (a) according to the present invention can provide a synergic effect.

Non-limiting examples of the sensitizer that may be used in combination with the above components of the photosensitive resin composition according to the present invention include benzophenone, 4,4'-bis(N,N-diethylamino)benzophenone, 4,4'-bis(N,N-dimethylamino)benzophenone, phenylbiphenylketone, 1-hydroxy-1-benzoylcyclohexane, benzyl, benzyldimethyl ketal, 2-benzyl-2-(dimethylamino)-4'-morpholinobutyrophenone, 2-methyl-4'-(methylthio)-2-morpholinopropiophenone, thioxanthone, 1-chloro-4-propoxythioxanthone, isopropylthioxanthone, diethylthioxanthone, ethylanthraquinone, 4-benzoyl-4'-methyldiphenylsulfide, benzoin butyl ether, 2-hydroxy-2-benzoylpropane, 2-hydroxy-2-(4'-isopropyl)benzoyl propane, 4-butylbenzoyltrichloromethane, 4-phenoxybenzoyldichloromethane, methyl benzoyl formate, 1,7-bis(9'-acridinyl) heptane, 9-n-butyl-3,6-bis(2'-morpholino-isobutyroyl)carbazole, 2,4,6-trimethylbenzoyl diphenylphosphineoxide, etc. The sensitizer is used preferably in an amount of 0.01-10 parts by weight based on 100 parts by weight of the total composition, more preferably in an amount of 0.1-2 parts by weight based on 100 parts by weight of the weight of the photopolymerization initiator used in the composition.

(f) Other Additives

The photosensitive resin composition according to the present invention optionally further comprises: thermal polymerization inhibitors such as hydroquinone, 4-methoxyphenol, quinone, pyrocatechol, t-butylcatechol, phenothiazine, etc.; plasticizers; silicone-based adhesion promoters; fillers or other additives generally used in a coating agent.

The photosensitive resin composition for a patterned spacer comprising the above components according to the present invention may be used in a display panel including a lower substrate and upper substrate, particularly in forming a patterned spacer that causes the lower and upper substrates to be spaced apart from each other by a predetermined distance.

In such display panels, a first electrode is disposed on one surface of the lower substrate and a second electrode is disposed on one surface of the upper substrate, both electrodes facing each other. Otherwise, both electrodes may be disposed on the lower substrate. In general, the lower substrate is used as drive substrate and the upper substrate is used as color filter substrate.

Additionally, the display panel has a display zone and a non-display zone distinguished from the display zone, and the patterned spacer is disposed on the non-display zone in an upright position so as to support the lower substrate and the upper substrate, which are spaced apart from each other by a predetermined distance.

There is no particular limitation in processes for preparing a patterned spacer by using the photosensitive resin composition for a patterned spacer comprising the above components according to the present invention. In other words, processes generally known to one skilled in the art may be used.

A process for preparing a patterned spacer according to a preferred embodiment of the present invention will be explained hereinafter.

First, the photosensitive resin composition according to the present invention is coated on the surface of a substrate by a spray coating method, roll coating method, slit-nozzle coating method, rotation coating method, extrusion coating method, bar coating method or combinations thereof.

To provide a non-flowable coating film after a coating film is formed, a step of evaporating a solvent under vacuum and/or heating may be carried out. Although heating conditions may be varied with the kind and proportion of each component, it is preferable that a hot plate is operated at 60-130° C. for 5-500 seconds or a heating oven is operated at 60-140° C. for 20-1000 seconds.

Then, the coating film having a decreased flowability due to the evaporation of solvent is irradiated with radiation by using a mask having a desired pattern. When irradiation is performed, exposure dose, exposure conditions and radiation type may be varied depending on resolution or mixing ratio of the components. According to the present invention, it is preferable to use radiation including ultraviolet rays such as g-line (wavelength: 436 nm), I-line (wavelength: 365 nm), h-line (wavelength: 405 nm); far ultraviolet rays such as eximer (krF, ArF) laser; X-rays such as synchrotron radiation; charged particulate rays such as electron ray, or the like, I-line, h-line and g-line being more preferable. Exposure may be carried out by using exposure processes such as contact, proximate and projection exposure processes.

Before carrying out an alkali-developing step after the exposure step, a post-exposure baking (PEB) step may be performed, if necessary. It is preferable that the PEB step is performed at a temperature of 150° C. or lower for about 0.1-10 minutes.

The developing step is one for removing undesired portions with an alkaline developer solution and may be carried out by removing non-exposed portions with an aqueous alkaline developer solution. Particular examples of the developer solution that may be used include aqueous alkaline solutions selected from the group consisting of: inorganic alkaline salts such as sodium hydroxide, potassium hydroxide, sodium carbonate, sodium silicate and sodium metasilicate, and ammonia and/or water; primary amines such as ethyl amine and n-propyl amine; secondary amines such as diethyl amine and n-propylamine; tertiary amines such as triethyl amine, methyl diethyl amine and n-methyl pyrrolidone; alcohol amines such as dimethyl ethylalcohol amine and triethylalcohol amine; quaternary ammonium salts such as tetramethylammonium hydroxide, tetraethylammonium hydroxide and choline; and amines such as pyrrole and piperidine. Additionally, it is possible to use a developer solution containing the above-mentioned aqueous alkaline solutions to which an adequate amount of surfactant or water soluble organic solvent such as methyl alcohol, ethyl alcohol, propyl alcohol, isopropyl alcohol, propylene glycol monomethyl ether and dipropylene glycol monomethyl ether.

The developing step is performed preferably in a time of about 15-200 seconds. General developing processes including a dipping process, spraying process and a puddle process may be used. After the developing step, the resultant substrate is washed with pure water for 20-200 seconds, and then water remaining on the substrate may be removed by using compressed air or nitrogen. By doing so, it is possible to form a desired pattern on the substrate.

Next, a post-baking or hard-baking step may be performed by using a heater such as a hot plate or oven. It is preferable that such heat treatment is carried out by using a hot plate at 150-250° C. for 5-60 minutes or by using an oven for 15-90 minutes. After the completion of the final heat treatment, it is possible to obtain a completely crosslinked and cured spacer pattern.

BEST MODE FOR CARRYING OUT THE INVENTION

Figure 1:
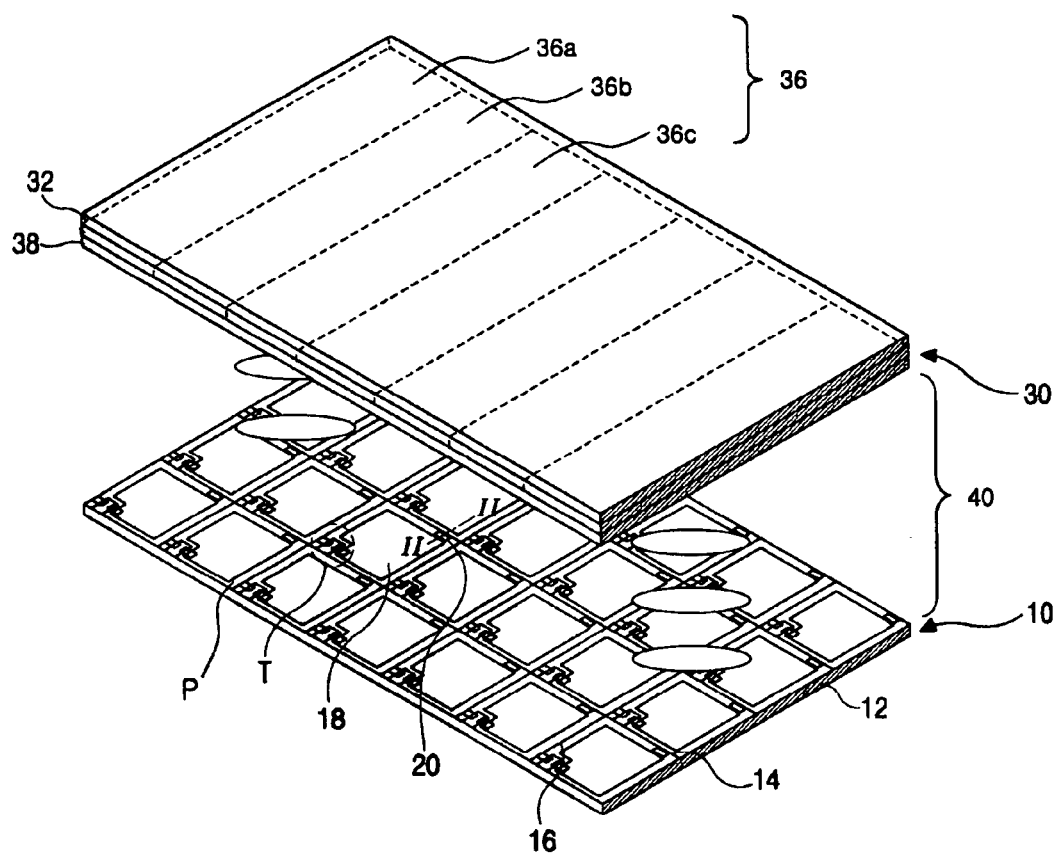
FIG. 1 is an exploded perspective view showing a liquid crystal display panel for a general liquid crystal display device using a patterned spacer.
Figure 2:
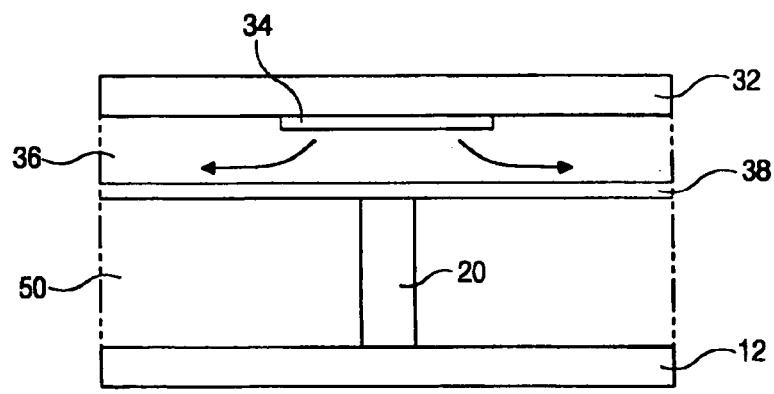
FIG. 2 is a sectional view taken along line II-II in FIG. 1.

Reference will now be made in detail to the preferred embodiments of the present invention. It is to be understood that the following examples are illustrative only and the present invention is not limited thereto.

Preparation Example 1

Preparation of 3-{4-[2,4-bis(trichloromethyl)-s-triazine-6-yl]phenylthio}propionic acid (Photopolymerization Initiator 1)

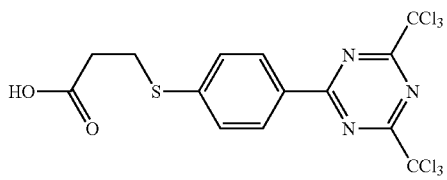

Step 1: Synthesis of 3-(4-cyanophenylthio)propionic acid

To 300 mL of DMF, 20 g of 4-fluorobenzonitrile (165 mmol), 20 g of 3-mercaptopropionic acid (188 mmol) and 50 g of potassium carbonate were introduced and subjected to reaction at a bath temperature of 100° C. for 20 hours.

After the reaction mixture was cooled to room temperature, the cooled reaction mixture was poured gradually into 1500 mL of distilled water. Then, the resultant mixture was acidified with 2N HCl solution (to about pH 2 as confirmed by using a sheet of pH test paper) to precipitate an organic compound. The precipitate was filtered, washed with distilled water, and then filtered again to separate the organic compound. Then, the organic compound was dried in a vacuum oven and subjected to structural analysis by NMR (yield: >86%).

Step 2: Synthesis of 3-{4-[2,4-bis(trichloromethyl)-s-triazine-6-yl]phenylthio}propionic acid A solution containing 22 g of 3-(4-cyanophenylthio) propionic acid (106 mmol) and 2 g of aluminum tribromide (AlBr$_3$) in 150 g of trichloroacetonitrile was dried at room temperature and bubbled with HCl. The solution was heated with a heat-gun in order to dissolve the starting materials remaining undissolved. The process of reaction was checked by TLC. The reaction product was formed gradually with the lapse of time. Then, the reaction was quenched after 24 hours and the reaction mixture was extracted with 1000 mL of diethyl ether. The resultant product was washed with deionized water and dried over anhydrous magnesium sulfate.

Substances with high volatility were removed from the dried product under vacuum and the resultant product was crystallized in methanol/water (yield: >87%). Then, the product was subjected to structural analysis by NMR, FT-IR and UV-Vis. spectrophotometers.

$^1$H NMR: (CDCl$_3$, ppm); 9.03 (1H, broad peak, COOH), 8.57 (2H, d, Ar—H), 7.41 (2H, d, Ar—H), 3.30 (2H, t, —CH$_2$—S), 2.78 (2H, t, UV-Vis. (nm): $\lambda_{max}$=356 nm

Preparation Example 2

Preparation of 1,1,1,3,3,3-hexafluoroisopropyl-3-{4-[2,4-bis(trichloromethyl)-s-triazine-6-yl]phenylthio}propionate (Photopolymerization Initiator 2)

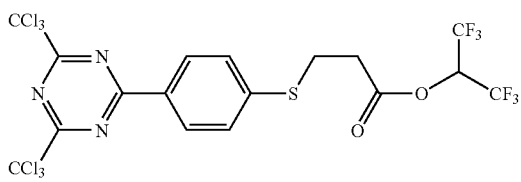

Step 1: Synthesis of 3-(4-cyanophenylthio)propionic acid

To 300 mL of DMF, 20 g of 4-fluorobenzonitrile (165 mmol), 20 g of 3-mercaptopropionic acid (188 mmol) and 50 g of potassium carbonate were introduced and subjected to reaction at a bath temperature of 135° C. for 20 hours.

After the reaction mixture was cooled to room temperature, the cooled reaction mixture was poured gradually into 1500 mL of distilled water. Then, the resultant mixture was acidified with 2N HCl solution (to about pH 2 as confirmed by using a sheet of pH test paper) to precipitate an organic compound. The precipitate was filtered, washed with distilled water, and then filtered again to separate the organic compound. Then, the organic compound was dried in a vacuum oven and subjected to structural analysis by NMR (yield: >86%).

Step 2: Synthesis of 1,1,1,3,3,3-hexafluoro isopropyl 3-(4-cyanophenylthio)propionate To obtain an acid chloride, ethyl ether may be used as solvent. Otherwise, thionyl chloride may be used as a reagent serving also as solvent.

8 g of 3-(4-cyanophenylthio)propionic acid (38.6 mmol) was mixed with 30 g of thionyl chloride at room temperature and the resultant mixture was subjected to reaction at 60° C. for 5 hours. Then, unreacted thionyl chloride was removed under vacuum and the resultant product was dissolved in 50 mL of THF. To the reactor, 5 g of pyridine and 10 g of hexafluoroisopropyl alcohol were introduced at room temperature. After carrying out the reaction at room temperature for 15 hours, 500 mL of distilled water was added thereto to remove salts, followed by extraction with ethyl ether. Then, the target compound was separated by column chromatography using hexane/ethyl ether (1/1) as eluent and subjected to structural analysis (yield: about 40%).

Step 3: Synthesis of 1,1,1,3,3,3-hexafluoro isopropyl-3-{4-[2,4-bis(trichloromethyl)-s-triazine-6-yl] phenylthio}propionate A solution containing 3.5 g of 1,1,1,3,3,3-hexafluoroisopropyl-3-(4-cyanophenylthio)propionate (10 mmol) and 0.5 g of aluminum tribromide (AlBr$_3$) in 30 g of trichloroacetonitrile was bubbled with HCl at room temperature. The process of reaction was checked by TLC. The reaction product was formed gradually with the lapse of time and solidified after 24 hours. Then, the reaction was quenched and the reaction mixture was extracted with 400 mL of ethyl ether. The resultant product was washed with deionized water and dried over anhydrous magnesium sulfate. Volatile substances were removed from the dried product under vacuum and the resultant product was crystallized in methanol (yield: >83%). Then, the product was subjected to structural analysis by NMR, FT-IR and UV-Vis. spectrophotometers.

$^1$H NMR: (CDCl$_3$, ppm); 8.62 (2H, d, Ar—H), 7.45 (2H, d, Ar—H), 5.77 (1H, m, OCH), 3.38 (2H, t, —CH$_2$—S), 2.93 (2H, t, —CH$_2$—).

UV-Vis. (nm): $\lambda_{max}$=354 nm.

Preparation Example 3

Preparation of ethyl 2-{4-[2,4-bis(trichloromethyl)-s-triazine-6-yl]phenylthio}acetate (Photopolymerization Initiator 3)

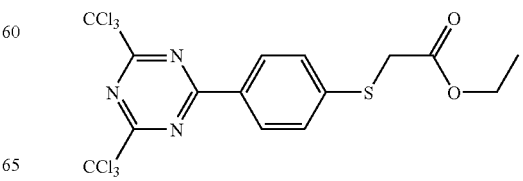

Step 1: Synthesis of ethyl 2-(4-cyanophenylthio)acetate

To 100 mL of DMF, 15 g of 4-fluorobenzonitrile (124 mmol), 16 g of ethyl 2-mercaptoacetate (133 mmol) and 25.0 g of potassium carbonate were introduced and subjected to reaction at a bath temperature of 130° C. for 20 hours.

After the reaction mixture was cooled to room temperature, the reaction mixture was poured gradually into 700 ml of distilled water, followed by extraction with ethyl ether. Then, the resultant product was washed with distilled water, dried over magnesium sulfate, filtered and evaporated to provide a crude target product. Then, the target product was separated and purified by column chromatography (eluent: hexane/ ethyl acetate=3/1). The product was subjected to structural analysis by NMR (yield: >76%).

Step 2: Synthesis of ethyl 2-{4-[2,4-bis(trichloromethyl-s-triazine-6-yl)phenylthio]acetate A mixed solution containing 10 g of ethyl 2-(4-cyanophenylthio)acetate (45.2 mmol), 0.8 g of $AlBr_3$ and 50 g of trichloroacetonitrile was bubbled with dry HCl at room temperature. The process of reaction was checked by TLC. The reaction product was formed gradually with the lapse of time while precipitation was formed. After hours, the reaction mixture was quenched and extracted with 500 mL of chloroform. The resultant product was washed with deionized water and dried over anhydrous magnesium sulfate. Volatile substances were removed from the dried product under vacuum and the target product was separated by column chromatography using hexane/ethyl acetate (3/1) as eluent (yield: >82%). Then, the product was subjected to structural analysis by NMR, FT-IR and UV-Vis. spectrophotometers.

$^1$H NMR: ($CDCl_3$, ppm); 8.58 (2H, d, Ar—H), 7.44 (2H, d, Ar—H), 4.22 (2H, q, O—$CH_2$—), 3.77 (2H, s, —$CH_2$—S), 1.25 (3H, t, —$CH_3$). UV-Vis. (nm): $\lambda_{max}$=352 nm.

Preparation Example 4

Preparation of 2-ethoxyethyl 2-{4-[2,4-bis(trichloromethyl)-s-triazine-6-yl]phenylthio}acetate (Photopolymerization Initiator 4)

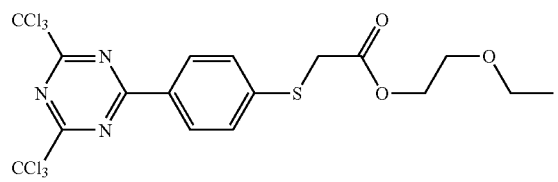

A mixed solution containing 10 g of 2-ethoxyethyl 2-(4-cyanophenylthio)acetate (37.7 mmol), 0.8 g of $AlBr_3$ and 50 g of trichloroacetonitrile was bubbled with dry HCl at room temperature. The process of reaction was checked by TLC. The reaction product was formed gradually with the lapse of time while precipitation was formed. After 24 hours, the reaction mixture was quenched and extracted with 500 mL of chloroform. The resultant product was washed with deionized water and dried over anhydrous magnesium sulfate. Volatile substances were removed from the dried product under vacuum and the target product was separated by column chromatography using hexane/ethyl acetate (3/1) as eluent (yield: 86%). Then, the product was subjected to structural analysis by NMR, FT-IR and UV-Vis. spectrophotometers.

$^1$H NMR: ($CDCl_3$, ppm); 8.57 (2H, d, Ar—H), 7.42 (2H, d, Ar—H), 4.17 (2H, t, —$CO_2$—$CH_2$—), 3.75 (2H, s, —$CH_2$—S), 1.22 (3H, t, —$CH_3$). UV-Vis. (nm): $\lambda_{max}$=353 nm.

Preparation Example 5

Preparation of cyclohexyl 2-{4-[2,4-bis(trichloromethyl)-s-triazine-6-yl]phenyl thio}acetate (Photopolymerization Initiator 5)

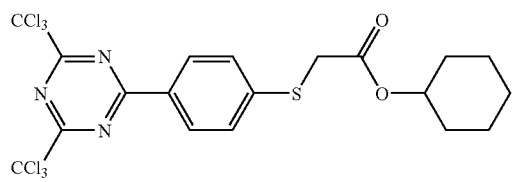

A mixed solution containing 10 g of cyclohexyl 2-(4-cyanophenylthio)acetate (36.3 mmol), 0.8 g of $AlBr_3$ and 50 g of trichloroacetonitrile was bubbled with dry HCl at room temperature. The process of reaction was checked by TLC. The reaction product was formed gradually with the lapse of time while precipitation was formed. After 24 hours, the reaction mixture was quenched and extracted with 500 mL of chloroform. The resultant product was washed with deionized water and dried over anhydrous magnesium sulfate. Volatile substances were removed from the dried product under vacuum and the target product was separated by column chromatography using hexane/ethyl acetate (3/1) as eluent (yield: 89%). Then, the product was subjected to structural analysis by NMR, FT-IR and UV-Vis. spectrophotometers.

$^1$H NMR: ($CDCl_3$, ppm); 8.57 (2H, d, Ar—H), 7.42 (2H, d, Ar—H), 4.77 (1H, m, —$CO_2$—CH—), 3.76 (2H, s, —$CH_2$—S). UV-Vis. (nm): $\lambda_{max}$=354 nm.

Preparation Example 6

Preparation of benzyl 2-{4-[2,4-bis(trichloromethyl)-s-triazine-6-yl]phenylthio}acetate (Photopolymerization Initiator 6)

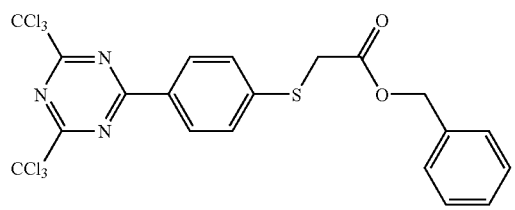

A mixed solution containing 10 g of cyclohexyl 2-(4-cyanophenylthio)acetate (35.3 mmol), 0.8 g of $AlBr_3$ and 50 g of trichloroacetonitrile was bubbled with dry HCl at room temperature. The process of reaction was checked by TLC. The reaction product was formed gradually with the lapse of time while precipitation was formed. After 24 hours, the reaction mixture was quenched and extracted with 500 mL of chloroform. The resultant product was washed with deionized water and dried over anhydrous magnesium sulfate. Volatile substances were removed from the dried product under vacuum and the target product was separated by column chromatography using hexane/ethyl acetate (3/1) as eluent (yield: 91%). Then, the product was subjected to structural analysis by NMR, FT-IR and UV-Vis. spectrophotometers.

$^1$H NMR: (CDCl$_3$, ppm); 8.57 (2H, d, Ar—H), 7.42 (2H, d, Ar—H), 7.33 (5H, m, Ar—H), 4.99 (2H, s, —CO$_2$—CH$_2$—), 3.75 (2H, s, —CH$_2$—S). UV-Vis. (nm): $\lambda_{max}$=352 nm.

Preparation Example 7

Preparation of 3-{3-chloro-4-[2,4-bis(trichloromethyl)-s-triazine-6-yl]phenylthio}propionic acid (Photopolymerization Initiator 7)

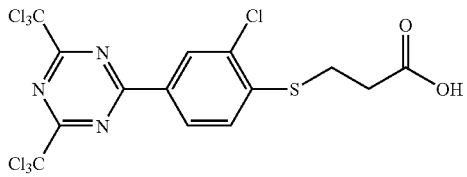

Step 1: Synthesis of 3-[(3-chloro-4-cyanophenyl)thio]propionic acid

To 50 mL of DMF, 5 g of 3-chloro-4-fluorobenzonitrile (32.1 mmol), 3.58 g of mercaptopropionic acid (33.7 mmol) and 11.1 g of potassium carbonate were introduced and subjected to reaction at a bath temperature of 100° C. for 15 hours.

After the reaction mixture was cooled to room temperature, the cooled reaction mixture was poured gradually into 500 mL of distilled water. Then, the resultant mixture was acidified with 4N HCl solution (to about pH 2 as confirmed by using a sheet of pH test paper) to precipitate an organic compound. The precipitate was filtered, washed with distilled water, and then filtered again to separate the organic compound. Then, the organic compound was dried in a vacuum oven and subjected to structural analysis by NMR (yield: >80%).

Step 2: Synthesis of 3-{3-chloro-4-[2,4-bis(trichloromethyl)-s-triazine-6-yl]phenylthio}propionic acid To a reactor, 5 g of 3-[(3-chloro-4-cyanophenyl)thio]propionic acid (20.7 mmol) and 50 g of trichloroacetonitrile (346.3 mmol) were introduced. Then, the solution was heated to 60° C. to dissolve the starting materials, 0.5 g of AlBr$_3$ was added thereto, and the reaction mixture was bubbled with dry HCl. The process of reaction was checked by TLC. The reaction product was formed gradually with the lapse of time. Then, the reaction was quenched after 40 hours and the reaction mixture was extracted with 200 mL of methylene chloride. The resultant product was washed with deionized water and dried over anhydrous magnesium sulfate. Substances with high volatility were removed from the dried product under vacuum and the resultant product was crystallized by adding hexane, followed by recrystallization in methanol/water (yield: >55%). Then, the product was subjected to structural analysis by NMR and UV-Vis. spectrophotometers.

$^1$H NMR: (Acetone-d$_6$, ppm); ~10 (1H, broad peak, COOH), 8.55 (1H, d, Ar—H), 8.54 (1H, s, Ar—H), 7.66 (1H, d, Ar—H), 3.40 (2H, t, —CH$_2$—S), 2.82 (2H, t, —CH$_2$—). UV-Vis. (nm): $\lambda_{max}$=357 nm.

Preparation Example 8

Preparation of 3-{4-[2,4-bis(trichloromethyl)-s-triazine-6-yl]phenylthio}propionamide (Photopolymerization Initiator 8)

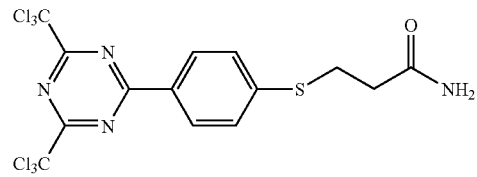

The compound represented by the above formula was obtained as byproduct during the preparation of Photopolymerization Initiator 1 in an amount of less than 5%. The compound was separated with ease by column chromatography using ethyl acetate as eluent. Then, the product was subjected to structural analysis by NMR and UV-Vis. spectrophotometers.

$^1$H NMR: (Acetone-d$_6$, ppm); 8.54 (2H, d, Ar—H), 7.54 (2H, d, Ar—H), 6.99 (1H, s, N—H), 6.51 (1H, s, N—H), 3.36 (2H, t, —CH$_2$—S), 2.78 (2H, t, —CH$_2$—). UV-Vis. (nm): $\lambda_{max}$=356.

The resin binders used in the following Examples and Comparative Examples are as follows.

[Binder-1]

A reactive binder (ternary copolymer obtained by ring opening/addition of a glycidyl norbornene derivative to copolymer of benzyl methacrylate/methacrylic acid (50/50)), acid value=90 KOH mg/g, Mw=20000.

[Binder-2]

A reactive binder (polymer obtained by ring opening/addition of glycidyl methacrylate to copolymer of benzyl methacrylate/methacrylic acid (50/50)), acid value=90 KOH mg/g, Mw=20000.

[Binder-3]

A linear binder (copolymer of benzyl methacrylate/methacrylic acid (75/25)), acid value=91 KOH mg/g, Mw=20000.

Examples illustrating preparation of the photosensitive resin composition according to the present invention will be described hereinafter.

Example 1

A solution including 20 parts by weight of Photopolymerization Initiator 1 obtained from Preparation Example 1, 200 parts by weight of Binder-1 (solid content basis), 100 parts by weight of dipentaerythritol hexaacrylate, 0.1 parts by weight of F177 as surfactant and 1000 parts by weight of propylene glycol monomethyl ether acetate was dissolved by using an agitator to a completely dissolved state. Then, the solution was filtered with a 0.2 micron filter to provide a solution of photosensitive composition (Composition 1).

Composition 1 was applied on a glass substrate by spin coating and the coated substrate was preliminarily heat treated for 100 seconds by using a hot plate at 100° C. to form a coating film. Then, a desired mask was disposed on the coating film and the resultant body was irradiated with UV rays by using a mercury lamp at 365 nm with a dose of 20 mW/cm² for 10 seconds. Development was performed with 0.04 wt % of aqueous potassium hydroxide solution at room temperature for 100 seconds, followed by washing with pure water for 50 seconds. Finally, the developed pattern was thermally cured by heating it in a hot oven maintained at 220° C. for 30 minutes to form a spacer pattern with a thickness of 4 µm.

Example 2

Example 1 was repeated to form a spacer pattern, except that Photopolymerization Initiator 2 obtained from Preparation Example 2 was used as photopolymerization initiator.

Example 3

Example 1 was repeated to form a spacer pattern, except that Photopolymerization Initiator 3 obtained from Preparation Example 3 was used as photopolymerization initiator.

Example 4

Example 1 was repeated to form a spacer pattern, except that Photopolymerization Initiator 4 obtained from Preparation Example 4 was used as photopolymerization initiator.

Example 5

Example 1 was repeated to form a spacer pattern, except that Photopolymerization Initiator 5 obtained from Preparation Example 5 was used as photopolymerization initiator.

Example 6

Example 1 was repeated to form a spacer pattern, except that Binder-2 as described above was used as binder.

Example 7

Example 1 was repeated to form a spacer pattern, except that Photopolymerization Initiator 6 obtained from Preparation Example 6 was used as photopolymerization initiator.

Example 8

Example 1 was repeated to form a space pattern, except that 20 parts by weight of Photopolymerization Initiator 7 obtained from Preparation Example 7, 150 parts by weight of Binder-2 (solid content basis), 150 parts by weight of dipentaerythritol hexaacrylate, 0.1 parts by weight of F177 as surfactant and 1000 parts by weight of propylene glycol monomethyl ether acetate were used.

Example 9

Example 7 was repeated to form a spacer pattern, except that Photopolymerization Initiator 8 obtained from Preparation Example 8 was used as photopolymerization initiator.

Example 10

Example 1 was repeated to form a space pattern, except that 10 parts by weight of Photopolymerization Initiator 1 obtained from Preparation Example 1, 10 parts by weight of Irgacure-369 (available from Ciba-Chemical Co.), which is an acetophenone-based photopolymerization initiator, 200 parts by weight of Binder-2 (solid content basis), 100 parts by weight of dipentaerythritol hexaacrylate, 0.1 parts by weight of F177 as surfactant, 500 parts by weight of propylene glycol monomethyl ether acetate and 500 parts by weight of 3-methoxybutyl acetate were used.

Comparative Example 1

Example 1 was repeated to form a spacer pattern, except that Irgacure-369 was used as photopolymerization initiator and Binder-3 as described above was used as binder.

Comparative Example 2

Example 1 was repeated to form a spacer pattern, except that Photopolymerization Initiator 1 obtained from Preparation Example 1 was used as photopolymerization initiator and Binder-3 as described above was used as binder.

Comparative Example 3

Example 1 was repeated to form a spacer pattern, except that Irgacure-369 was used as photopolymerization initiator and Binder-2 as described above was used as binder.

Comparative Example 4

Example 1 was repeated to form a spacer pattern, except that Photopolymerization Initiator 1 obtained from Preparation Example 1 was used in an amount of 0.05 parts by weight based on 100 parts by weight of the total composition.

Comparative Example 5

Example 1 was repeated to form a spacer pattern, except that Photopolymerization Initiator 1 obtained from Preparation Example 1 was used in an amount of 11 parts by weight based on 100 parts by weight of the total composition.

Comparative Example 6

Example 1 was repeated to form a spacer pattern, except that Binder-1 as described above was used as binder in an amount of 9 parts by weight based on 100 parts by weight of the total solid content and dipentaerythritol hexaacrylate was used in an amount corresponding to [(combined solid content of the binder and dipentaerythritol hexaacrylate in Example 1)−9 parts by weight].

Comparative Example 7

Example 1 was repeated to form a spacer pattern, except that Binder-1 as described above was used as binder in an amount of 91 parts by weight based on 100 parts by weight of the total solid content and dipentaerythritol hexaacrylate was used in an amount corresponding to [(combined solid content of the binder and dipentaerythritol hexaacrylate in Example 1)−91 parts by weight].

Comparative Example 8

Example 1 was repeated to form a spacer pattern, except that dipentaerythritol hexaacrylate was used in an amount of 81 parts by weight based on 100 parts by weight of the total solid content and Binder-1 was used in an amount corresponding to [(combined solid content of the binder and dipentaerythritol hexaacrylate in Example 1)−81 parts by weight].

[Evaluation for Physical Properties of Spacer Compositions]

The spacer compositions or spacer patterns obtained from the above Examples and Comparative Examples are evaluated for their physical properties as follows.

(1) Sensitivity: In the sensitivity test carried out according to the present invention, sensitivity is defined as exposure dose where a pattern can be formed with a mask of 10 μm×10 μm size. Sensitivity was measured while varying the exposure dose. As exposure dose decreases, sensitivity becomes higher. For a light source, lights with the whole range of wavelengths emitted from a high-pressure mercury lamp were used with no filter for a certain wavelength. Exposure was measured at 365 nm (I-line).

(2) Residue Characteristics: After development, portions to be developed were observed for the residue remaining unwashed and were measured for the amount of residue. When any residue was not present, the spacer composition was expressed by the term "good" in the following Table 1. When residue was observed, the spacer composition was expressed by the term "poor" in the following Table 1.

(3) Film Uniformity: A spacer pattern was formed on a glass substrate of 350×450 (mm) size and then the film thickness was measured. Film uniformity was determined by using the maximum thickness and minimum thickness as follows: non-uniformity=(maximum thickness−minimum thickness)/(2×average film thickness)×100(%). As the non-uniformity value decreases, spacer compositions with higher quality can be obtained. When the non-uniformity value was less than 1%, the spacer composition was expressed by the term "excellent" in the following Table 1. When the non-uniformity value ranges from 1% to 2%, the spacer composition was expressed by the term "good". Additionally, when the non-uniformity value is greater than 2%, the spacer composition was expressed by the term "poor".

(4) Residual Film Ratio: The film thickness was measured before and after the post-heat treatment. Then, the residual film ratio was determined by using the formula of [residual film ratio=(film thickness after post-heat treatment)/(film thickness before post-heat treatment)×100(%)]. As the residual film ratio increases, spacer compositions with higher quality can be obtained. When the residual film ratio was greater than 85%, the spacer composition was expressed by the term "good". Otherwise, the spacer composition was expressed by the term "poor".

(5) Heat Resistance: After a final spacer pattern was formed, it was observed for variations in thickness due to thermal impacts. A spacer of high quality is defined as one showing insignificant variations in thickness after the lapse a predetermined time under high temperature. Thickness maintenance is calculated from the formula of [thickness maintenance=(film thickness after heat treatment)/(film thickness before heat treatment)×100(%)]. When a film had a thickness maintenance of 90% or more after it is heated at 240° C. for 1 hour, the spacer composition used in the film was expressed by the term "good". Otherwise, the spacer composition was expressed by the term "poor".

(6) Chemical Resistance: The spacers were determined for chemical resistance by leaving them in various chemical substances (10% aqueous solution of NaOH, 10% aqueous solution of HCl, NMP) and measuring variations in thickness. Similarly to the above Heat resistance test, spacer with higher quality can be obtained as the thickness variation decreases. The thickness variation is calculated from the formula of [Thickness variation=(film thickness after chemical treatment)/(film thickness before chemical treatment)×100(%)]. After dipped in each chemical substance at room temperature for 1 hour, the spacer providing a thickness variation of 103% or less was expressed by the term "good". Otherwise, the spacer was expressed by the term "poor".

(7) CD (Critical Dimension) Control: When upper and lower CDs of a finally formed spacer pattern were controlled with ease by adjusting the components and contents of the spacer composition (i.e., when CD values obtained under a certain pattern forming condition could be controlled in the range of from +20% to −20%), the spacer pattern was expressed by the term "ease". Otherwise, the spacer pattern was expressed by the term "difficult".

(8) Mechanical Properties: The so-called elastic restorability of a spacer pattern is defined as a degree of restoration into the original shape of the pattern, when the pattern is subjected to strain corresponding to 10% (which is variable depending on conditions) of the thickness after the pattern formation. Absolute values of elastic restorability significantly vary with the pattern conditions. After the spacer patterns formed according to Examples 1-10 and Comparative Examples 1-9 under the same conditions were compared relative to each other, the spacer pattern having the lowest elastic restorability was expressed by the term "poor". Other spacer patterns were expressed by the term "good" or "excellent".

The following Table 1 shows physical properties of the spacer compositions measured as described above.

TABLE 1

| Composition | Sensitivity (mJ/cm$^2$) | Residue Characteristics | Film Uniformity | Residual Film Ratio | Heat Resistance | Chemical Resistance | CD Control | Mechanical Properties |
|---|---|---|---|---|---|---|---|---|
| Ex. 1 | 80 | good | excellent | good | good | good | easy | excellent |
| Ex. 2 | 80 | good | good | good | good | good | easy | excellent |
| Ex. 3 | 80 | good | good | good | good | good | easy | excellent |
| Ex. 4 | 80 | good | good | good | good | good | easy | excellent |
| Ex. 5 | 80 | good | good | good | good | good | easy | excellent |
| Ex. 6 | 80 | good | good | good | good | good | easy | excellent |
| Ex. 7 | 80 | good | good | good | good | good | easy | excellent |
| Ex. 8 | 80 | good | excellent | good | good | good | easy | excellent |
| Ex. 9 | 80 | good | excellent | good | good | good | easy | excellent |
| Ex. 10 | 80 | good | good | good | poor | poor | easy | excellent |
| Comp. Ex. 1 | 200 | good-poor | good | poor | good | poor | difficult | poor |
| Comp. Ex. 2 | 150 | good | good | good | poor | poor | difficult | good |
| Comp. Ex. 3 | 150 | good-poor | good | poor | good | poor | difficult | good |
| Comp. Ex. 4 | 250 | poor | poor | poor | poor | poor | difficult | poor |
| Comp. Ex. 5 | 80 | good | good | excellent | good | good | difficult | good |

TABLE 1-continued

| Composition | Sensitivity (mJ/cm$^2$) | Residue Characteristics | Film Uniformity | Residual Film Ratio | Heat Resistance | Chemical Resistance | CD Control | Mechanical Properties |
|---|---|---|---|---|---|---|---|---|
| Comp. Ex. 6 | 150 | poor | poor | good | good | good | difficult | poor |
| Comp. Ex. 7 | 250 | poor | poor | poor | poor | poor | difficult | poor |
| Comp. Ex. 8 | 200 | poor | poor | excellent | good | good | difficult | poor |

*good-poor: although non-exposed portions to be developed were washed cleanly, very fine residue was observed around the exposed portions (around the patterned spacer).

It is difficult for the photosensitive resin composition of Comparative Example 2, which includes the triazine-based photopolymerization initiator represented by the above formula 1 as photopolymerization initiator but uses a linear binder rather than a photopolymerizable reactive resin binder as alkali-soluble resin binder, to realize a sensitivity of 80 mJ/cm$^2$ as high as the sensitivity of the composition of Example 1. However, the composition of Comparative Example 2 shows a sensitivity of 150 mJ/cm$^2$, which is higher than the sensitivity of the composition of Comparative Example 1. Additionally, the photosensitive composition of Comparative Example 2 shows a limitation in increasing CD (critical dimension), which is one of the most important characteristics of a patterned spacer, and has insignificantly improved mechanical properties.

As can be seen from the results obtained from Comparative Example 2, when a photopolymerizable reactive resin binder is not used (even if a triazine-based photopolymerization initiator is used), there is a limitation in increasing CD and it is not possible to obtain sufficient heat resistance and chemical resistance of a film.

Meanwhile, the photosensitive resin composition of Comparative Example 3, which includes Irgacure-369 used currently in the art as photopolymerization initiator and a photopolymerizable reactive resin binder as alkali-soluble resin binder, shows a sensitivity of 150 mJ/cm$^2$, which is higher than the sensitivity of the composition of Comparative Example 1. When Irgacure-369 is used alone, it is difficult to control the CD of a pattern because an excessively scattered pattern is formed under the same exposure dose. Moreover, due to the nature of such scattered patterns, a tailing phenomenon occurs easily on edge portions of the patterns, thereby providing a possibility for generation of residue upon development. When a reactive binder is used in the same manner as Comparative Example 3 (even if Irgacure-369 is used as photopolymerization initiator), it is possible to ensure physical properties to a certain degree. However, it is difficult to provide excellent mechanical properties as can be seen from the poor results in heat resistance and chemical resistance.

INDUSTRIAL APPLICABILITY

As can be seen from the foregoing, the photosensitive resin composition according to the present invention, which includes a triazine-based photopolymerization initiator as photopolymerization initiator combined with a photopolymerizable reactive resin binder as alkali-soluble resin binder, shows high sensitivity and excellent properties related with development.

Additionally, when a patterned spacer is formed by using the photosensitive resin composition according to the present invention, it is possible to obtain a patterned spacer having excellent strength, sensitivity, residue characteristics, film uniformity, residual film ratio, etc.

While this invention has been described in connection with what is presently considered to be the most practical and preferred embodiment, it is to be understood that the invention is not limited to the disclosed embodiment and the drawings. On the contrary, it is intended to cover various modifications and variations within the spirit and scope of the appended claims.

The invention claimed is:

1. A display panel including a lower substrate, upper substrate, and a patterned spacer that causes the lower substrate and upper substrate to be spaced apart from each other by a predetermined distance, wherein the patterned spacer is obtained from a photosensitive resin composition comprising:
(a) a triazine-based photopolymerization initiator represented by the following formula 1;
(b) an alkali-soluble photopolymerizable reactive resin binder having an acid value of about 30-200 KOH mg/g, which is obtained by polymerization of: an alkali-soluble linear copolymer obtained by copolymerization of an acid functional group-containing monomer with a monomer copolymerizable therewith; and an epoxy group-containing ethylenically unsaturated compound; and
(c) a polymerizable compound:
wherein the epoxy group-containing ethylenically unsaturated compound is glycidyl 5-norbornene-2-carboxylate (endo/exo mixture), and
the acid functional group-containing monomer is selected from the group consisting of (meth)acrylic acid, crotonic acid, itaconic acid, maleic acid, fumaric acid, monomethylmaleic acid, isoprenesulfonic acid, styrenesulfonic acid and 5-norbornene-2-carboxylic acid,

[Formula 1]

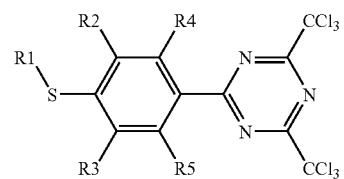

wherein R1 is selected from the group consisting of $C_nH_{2n}CONH_2$ (wherein n is an integer of 1~12), $C_nH_{2n}COOC_mH_{2m+1}$ (wherein n is an integer of 1~12 and m is an integer of 0~12), $(CH_2)_n COOC_mH_{2m}OC_1H_{2m+1}$ (wherein n is an integer of 1~12, m is an integer of 1~12 and l is an integer of 1~12), $(CH_2)_nCOO$-cyclo-$C_mH_{2m-1}$ (wherein n is an integer of 1~12, m is an integer of 3~12), $C_nH_{2n}COOR_f$ (wherein n is an integer of 1~12 and $R_f$ is an alkyl group whose hydrogen atoms are partially or totally substituted with fluorine atoms), and $C_nH_{2n}COOR_6$ (wherein n is an integer of 1~12 and $R_6$ is an aryl group or a C1-C6 alkyl group having an aryl group); and each of R2, R3, R4 and R5 is independently selected from the group consisting of a hydrogen atom, halogen atom, C1-C6 alkyl group and a C1-C6 alkoxy group.

2. The display panel according to claim 1, wherein the patterned spacer has a thickness of between 1 μm and 5 μm.

3. The display panel according to claim 1, wherein an electrode is disposed on each of the lower substrate and upper substrate in such a manner that both electrodes face each other, or both electrodes are disposed on the lower substrate.

4. The display panel according to claim 1, wherein the display panel has a display zone and a non-display zone distinguished from the display zone, and the patterned spacer is disposed on non-display zone in an upright position so as to support the lower substrate and the upper substrate which are spaced apart from each other by a predetermined distance.

5. The display panel according to claim 1, which is a liquid crystal display panel, wherein a liquid crystal layer is interposed between the upper substrate and lower substrate.

6. The display panel according to claim 1, wherein either or both of the lower substrate and upper substrate are transparent substrates.

7. The display panel according to claim 1, wherein triazine-based photopolymerization initiator (a) is selected from the group consisting of compounds represented by the following formulae:

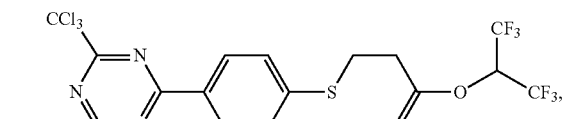

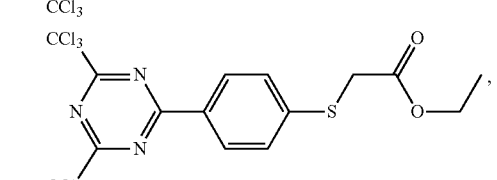

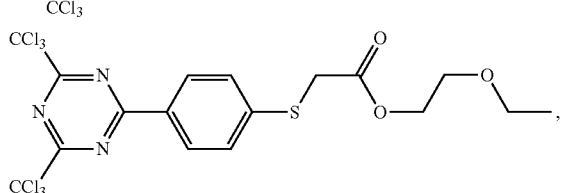

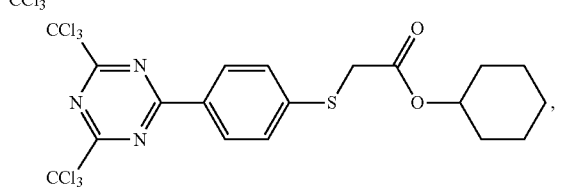

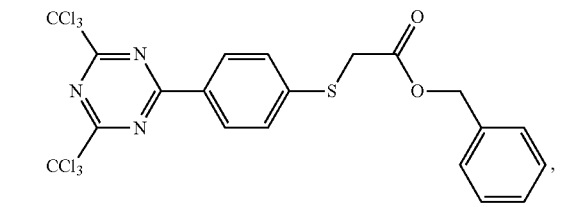

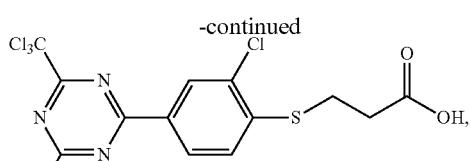

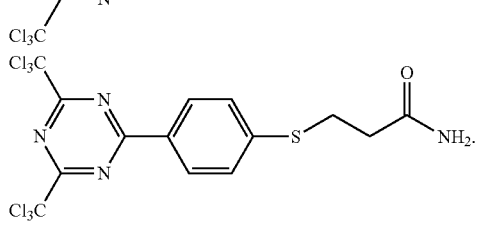

8. The display panel according to claim 1, wherein polymerizable compound (c) is a functional monomer having an ethylenically unsaturated bond.

9. A photosensitive resin composition for use in a patterned spacer, which comprises:
(a) a triazine-based photopolymerization initiator represented by the following formula 1;
(b) an alkali-soluble photopolymerizable reactive resin binder having an acid value of about 30-200 KOH mg/g, which is obtained by polymerization of: an alkali-soluble linear copolymer obtained by copolymerization of an acid functional group-containing monomer with a monomer copolymerizable therewith; and an epoxy group-containing ethylenically unsaturated compound;
(c) a polymerizable compound; and
(d) a solvent:
wherein the epoxy group-containing ethylenically unsaturated compound is glycidyl 5-norbornene-2-carboxylate (endo/exo mixture), and
the acid functional group-containing monomer is selected from the group consisting of (meth)acrylic acid, crotonic acid, itaconic acid, maleic acid, fumaric acid, monomethylmaleic acid, isoprenesulfonic acid, styrenesulfonic acid and 5-norbornene-2-carboxylic acid,

[Formula 1]

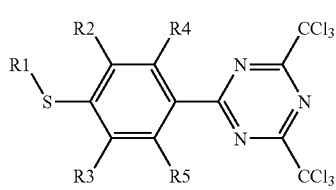

wherein R1 is selected from the group consisting of $C_nH_{2n}CONH_2$ (wherein n is an integer of 1~12), $C_nH_{2n}COOC_mH_{2m+1}$ (wherein n is an integer of 1~12 and m is an integer of 0~12), $(CH_2)_nCOOC_mH_{2m}OC_lH_{2l+1}$ (wherein n is an integer of 1~12, m is an integer of 1~12 and l is an integer of 1~12), $(CH_2)_nCOO\text{-cyclo-}C_mH_{2m-1}$ (wherein n is an integer of 1~12, m is an integer of 3~12), $C_nH_{2n}COOR_f$ (wherein n is an integer of 1~12 and $R_f$ is an alkyl group whose hydrogen atoms are partially or totally substituted with fluorine atoms), and $C_nH_{2n}COOR_6$ (wherein n is an integer of 1~12 and $R_6$ is an aryl group or a C1-C6 alkyl group having an aryl group); and
each of R2, R3, R4 and R5 is independently selected from the group consisting of a hydrogen atom, halogen atom, C1-C6 alkyl group and a C1-C6 alkoxy group.

10. The photosensitive resin composition for use in a patterned spacer according to claim 9, which comprises:
   (a) 0.1-10 parts by weight of the triazine-based photopolymerization initiator represented by formula 1, based on 100 parts by weight of the total composition;
   (b) 10-90 parts by weight of the alkali-soluble photopolymerizable reactive resin binder, based on 100 parts by weight of the total solid content of the photosensitive resin composition;
   (c) 10-80 parts by weight of the polymerizable compound, based on 100 parts by weight of the total solid content of the photosensitive resin composition; and
   (d) 60-90 parts by weight of the solvent, based on 100 parts by weight of the total composition.

11. The photosensitive resin composition for use in a patterned spacer according to claim 9, wherein triazine-based photopolymerization initiator (a) is selected from the group consisting of compounds represented by the following formulae:

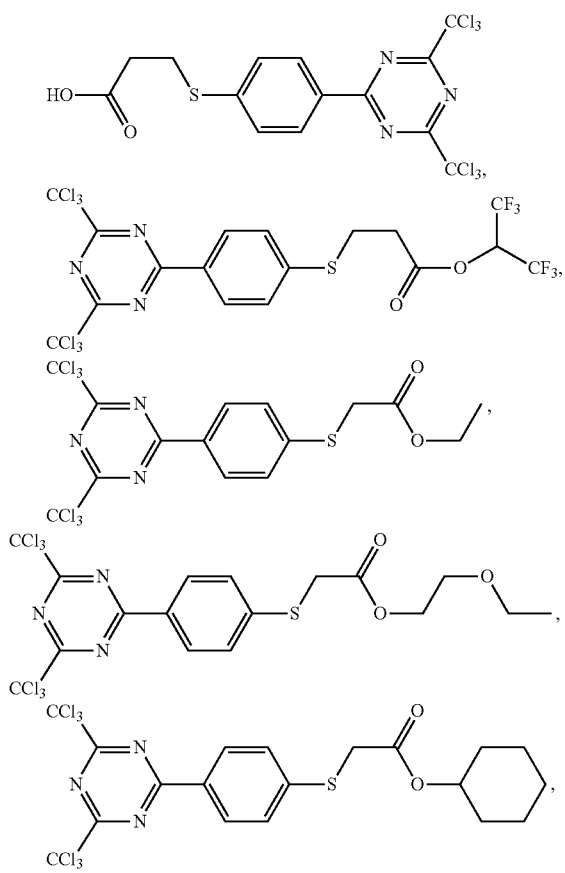

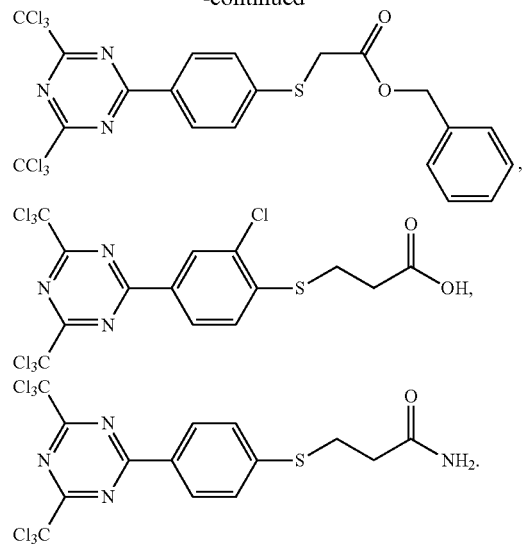

12. The photosensitive resin composition for use in a patterned spacer according to claim 9, wherein polymerizable compound (c) is a functional monomer having an ethylenically unsaturated bond.

13. The photosensitive resin composition for use in a patterned spacer according to claim 9, which further comprises a sensitizer.

14. The photosensitive resin composition for use in a patterned spacer according to claim 13, wherein the sensitizer is selected from the group consisting of:
   benzophenone, 4,4'-bis(N,N-diethylamino)benzophenone, 4,4'-bis(N,N-dimethylamino)benzophenone, phenylbiphenyl ketone, 1-hydroxy-1-benzoylcyclohexane, benzyl, benzyldimethyl ketal, 2-benzyl-2-(dimethylamino)-4'-morpholinobutyrophenone, 2-methyl-4'-(methylthio)-2-morpholinopropiophenone, thioxanthone, 1-chloro-4-propoxythioxanthone, isopropylthioxanthone, diethylthioxanthone, ethylanthraquinone, 4-benzoyl-4'-methyldiphenylsulfide, benzoin butyl ether, 2-hydroxy-2-benzoylpropane, 2-hydroxy-2-(4'-isopropyl)benzoyl propane, 4-butylbenzoyltrichloromethane, 4-phenoxybenzoyldichloromethane, methyl benzoylformate, 1,7-bis(9'-acridinyl)heptane, 9-n-butyl-3,6-bis(2'-morpholinoisobutyroyl)carbazole, and 2,4,6-trimethylbenzoyl diphenylphosphineoxide.

15. The photosensitive resin composition for use in a patterned spacer according to claim 13, wherein the sensitizer is present in an amount of 0.01-10 parts by weight based on 100 parts by weight of the total composition.

* * * * *